US012745605B2

(12) United States Patent
Kageyama

(10) Patent No.: US 12,745,605 B2
(45) Date of Patent: Sep. 22, 2026

(54) METHOD OF MANUFACTURING LIGHT EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 278 days.

(21) Appl. No.: 18/343,426

(22) Filed: Jun. 28, 2023

(65) Prior Publication Data

US 2024/0006248 A1 Jan. 4, 2024

(30) Foreign Application Priority Data

Jun. 30, 2022 (JP) ................................ 2022-105627

(51) Int. Cl.
*H10P 74/20* (2026.01)
*H10H 20/01* (2025.01)
(Continued)

(52) U.S. Cl.
CPC ........... *H10P 74/207* (2026.01); *H10H 20/01* (2025.01); *H10H 20/0364* (2025.01); (Continued)

(58) Field of Classification Search
CPC ......... H01L 21/78; H01L 22/14; H01L 22/22; H01L 22/32; H01L 25/0753;
(Continued)

(56) References Cited

U.S. PATENT DOCUMENTS 6,875,560 B1 * 4/2005 Steffan ............... G01R 31/2884 430/315
9,171,882 B2 * 10/2015 Akimoto ............. H10H 29/142
(Continued)

FOREIGN PATENT DOCUMENTS

JP S63306687 A 12/1988
JP H05218172 A 8/1993
(Continued)

*Primary Examiner* — Christine S. Kim
*Assistant Examiner* — Tien Tran
(74) *Attorney, Agent, or Firm* — Hunton Andrews Kurth LLP

(57) ABSTRACT

A method of manufacturing a light emitting device comprises: providing a structure body including a substrate and a plurality of semiconductor parts arranged on the substrate, wherein the semiconductor parts individually includes a first semiconductor layer, a second semiconductor layer, a first terminal and a second terminal; disposing an insulating member that covers the semiconductor parts; forming wirings at locations above the semiconductor parts, wherein, the wirings each connect the first terminal and the second terminal of two adjacent semiconductor parts in a direction of arrangement, the wirings serially connect the semiconductor parts, and an area of individual of the wirings is larger than an area of the first terminal or an area of the second terminal in a top view; evaluating electrical properties of the semiconductor parts connected by the wirings by bringing a testing device into contact with the wiring; and removing the insulating member and the wirings.

6 Claims, 13 Drawing Sheets

(51) Int. Cl.

| | |
|---|---|
| ***H10H 20/857*** | (2025.01) |
| ***H10H 29/14*** | (2025.01) |
| ***H10P 74/00*** | (2026.01) |

(52) U.S. Cl.
CPC ........ *H10H 20/857* (2025.01); *H10H 29/142* (2025.01); *H10P 74/232* (2026.01); *H10P 74/238* (2026.01); *H10P 74/273* (2026.01)

(58) Field of Classification Search
CPC .. H01L 25/167; H10H 20/01; H10H 20/0364; H10H 20/83; H10H 20/857; H10H 29/142; H10H 29/0364; H10H 29/10; H10P 74/273
See application file for complete search history.

(56) References Cited

U.S. PATENT DOCUMENTS

| | | | | |
|---|---|---|---|---|
| 11,862,751 | B2 * | 1/2024 | Tsai | H01L 21/6835 |
| 2011/0193114 | A1 * | 8/2011 | Lerman | F21K 9/20 257/91 |
| 2012/0273823 | A1 * | 11/2012 | Yoneda | H10H 20/8312 438/46 |
| 2013/0248917 | A1 * | 9/2013 | Obata | H10H 20/831 438/23 |
| 2014/0175471 | A1 | 6/2014 | Akimoto et al. | |
| 2015/0069437 | A1 * | 3/2015 | Tomizawa | H10H 20/853 257/98 |
| 2016/0156157 | A1 | 6/2016 | Matsubara et al. | |
| 2021/0062989 | A1 * | 3/2021 | Joe | F21S 43/15 |
| 2022/0189834 | A1 | 6/2022 | Lin | |
| 2025/0046660 | A1 * | 2/2025 | Ng | H10H 20/831 |

FOREIGN PATENT DOCUMENTS

| | | | |
|---|---|---|---|
| JP | 2005129583 | A | 5/2005 |
| JP | 2005303163 | A | 10/2005 |
| JP | 2013038212 | A | 2/2013 |
| JP | 2020102616 | A | 7/2020 |
| JP | 2022093260 | A | 6/2022 |
| WO | 2015011984 | A1 | 1/2015 |

* cited by examiner

METHOD OF MANUFACTURING LIGHT EMITTING DEVICE

CROSS-REFERENCE TO RELATED APPLICATION

This application claims priority to Japanese Patent Application No. 2022-105627, filed on Jun. 30, 2022, the disclosure of which is hereby incorporated by reference in its entirety.

BACKGROUND

Certain embodiments of the present disclosure relate to a method of manufacturing a light emitting device.

Japanese Patent Publication No. 2005-129583 discloses a technique to individually evaluate surface emitting lasers by short circuiting the electrodes on one side of a number of surface emitting lasers arranged on a device by using a short circuiting pattern, and applying a voltage across the short circuiting pattern and the common electrodes of the surface emitting lasers.

An embodiment of the present disclosure provides a method of manufacturing a light emitting device that can facilitate the evaluation of the light emitting device.

A method of manufacturing a light emitting device according to an embodiment of the present disclosure includes: comprises: providing a structure body wherein, the structure body including a substrate and a plurality of semiconductor parts arranged on the substrate wherein the semiconductor parts individually includes a first semiconductor layer of a first conductivity type, a second semiconductor layer of a second conductivity type, a first terminal electrically connected to the first semiconductor layer, and a second terminal electrically connected to the second semiconductor layer; disposing an insulating member that covers the semiconductor parts while exposing the first terminals and the second terminals; forming wirings at locations above the semiconductor parts, wherein, the wirings each is connected to the first terminal and the second terminal of two adjacent semiconductor parts in a direction of arrangement, the wirings serially connect the semiconductor parts, and in a top view, an area of each of the wirings is larger than an area of the first terminal to which it is connected and is larger than an area of the second terminal to which it is connected; evaluating electrical properties of the semiconductor parts connected by the wirings by bringing a testing device into contact with the wiring; and removing the insulating member and the wirings.

According to an embodiment of the present disclosure, a method of manufacturing a light emitting device that can facilitate the evaluation of the light emitting device can be provided.

EMBODIMENTS

Figure 1:
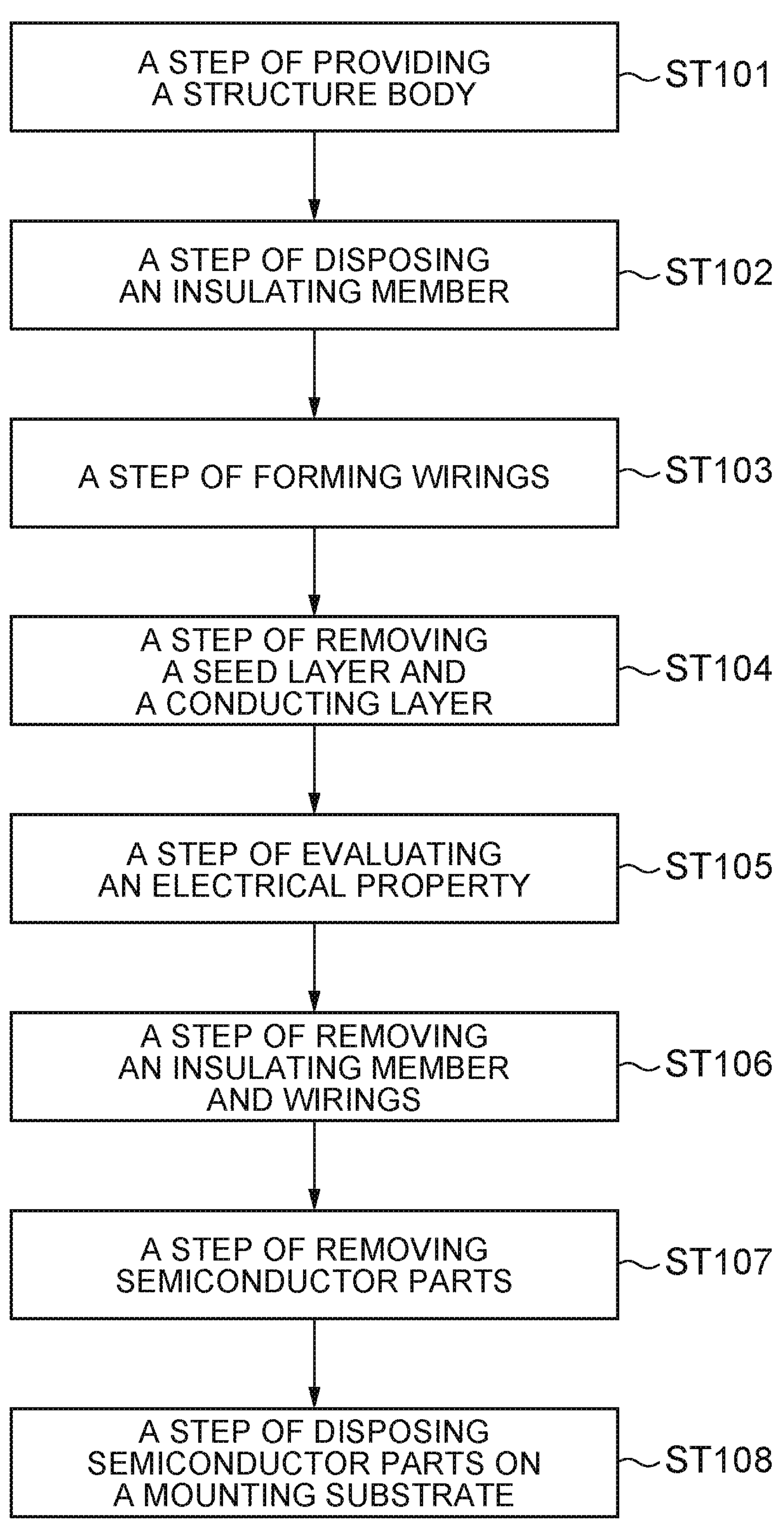
FIG. 1 is a flowchart showing an example of a method of manufacturing a light emitting device according to an embodiment.

Certain embodiments of the present disclosure will be explained below with reference to the accompanying drawings.

The drawings are schematic or conceptual. As such, the relationships of the thicknesses and the widths between the members or the size ratio of the members might not necessarily be the same as those in reality. Even when showing the same portion, the dimensions of or the ratio between the members might be different depending on the drawing.

In the present specification and the drawings, the elements that are similar to those which have been described using a drawing previously referenced are denoted by the same reference numerals for which detailed explanation will be omitted as appropriate.

Figure 2:
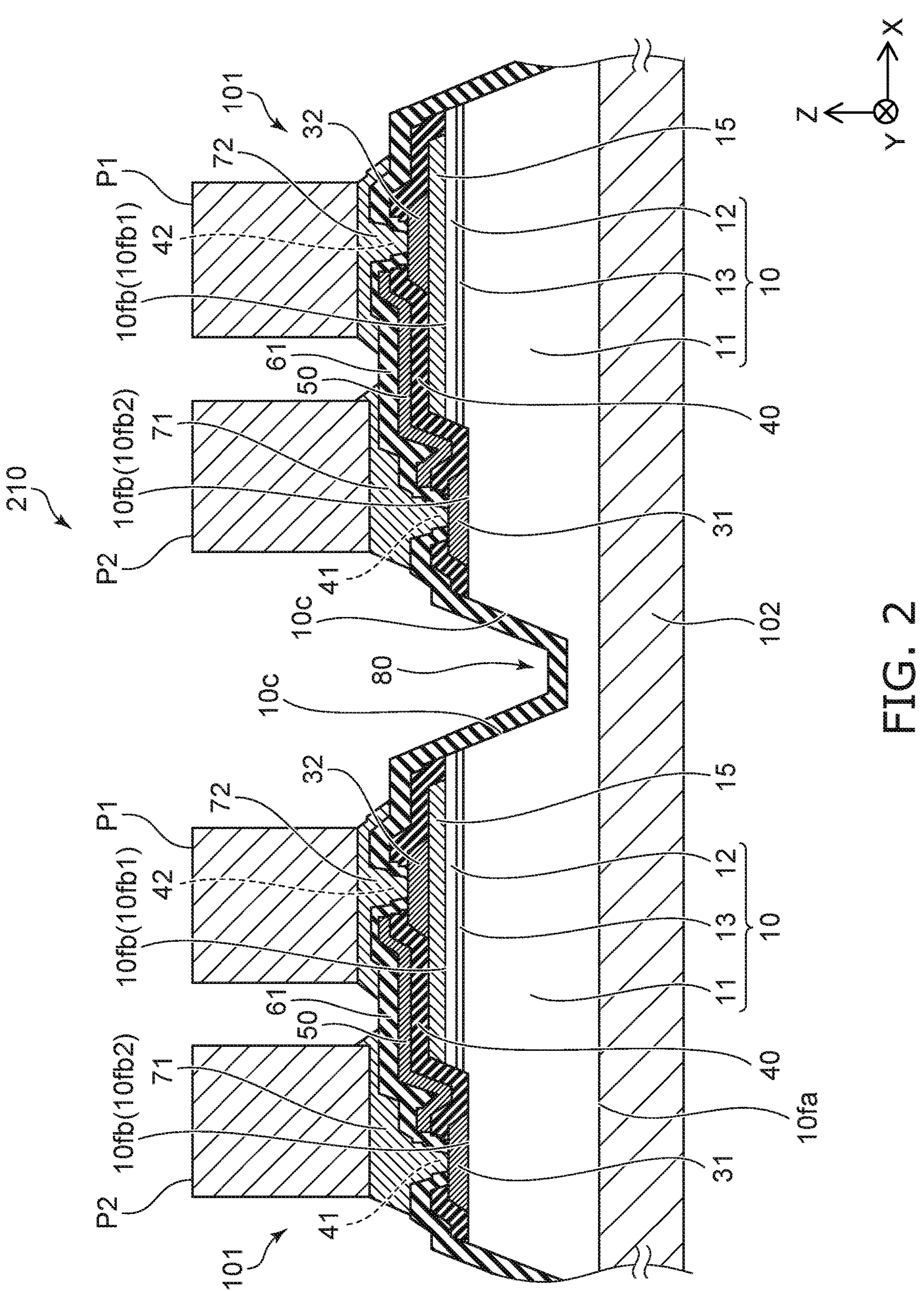
FIG. 2 is a schematic cross-sectional view explaining the example of a method of manufacturing a light emitting device according to the embodiment.
Figure 3:
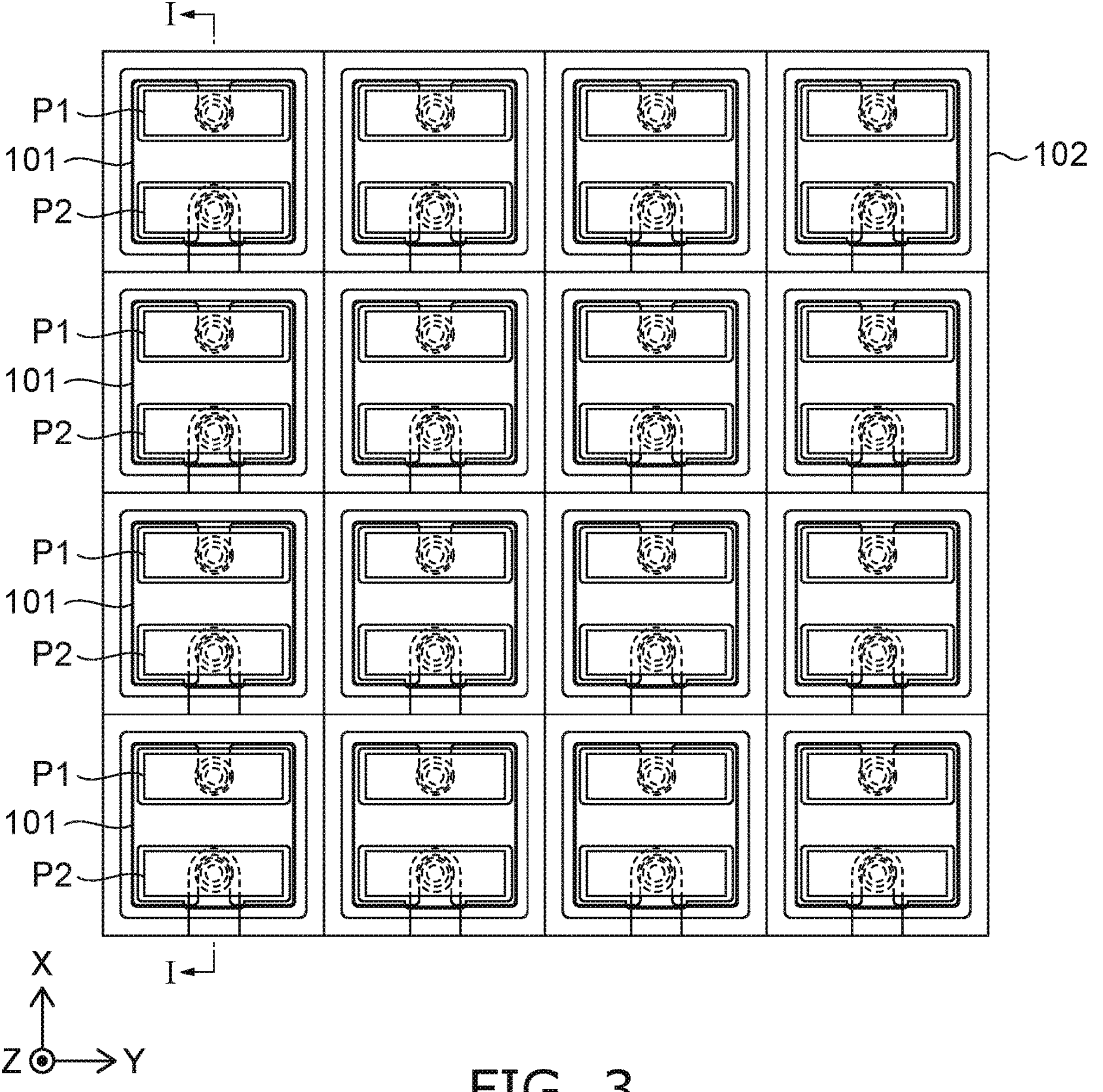
FIG. 3 is a schematic top view showing a portion of a structure body.

FIG. 1 is a flowchart showing one example of a method of manufacturing a light emitting device according to an embodiment. FIG. 2 is a schematic cross-sectional view explaining the example of a method of manufacturing a light emitting device according to the embodiment. FIG. 2 shows an example of a portion of the cross section taken along line I-I in FIG. 3. FIG. 3 is a schematic top view showing a portion of a structure body.

As shown in FIG. 1 and FIG. 2, a step of providing a structure body 210 (Step ST101) is conducted first. As shown in FIG. 2, the structure body 210 includes a substrate 102 and a plurality of semiconductor parts 101 arranged on the substrate 102. Each of the semiconductor parts 101 has a first semiconductor layer 11 of a first conductivity type, a second semiconductor layer 12 of a second conductivity type, a first terminal P1 electrically connected to the first semiconductor layer 11, and a second terminal P2 electrically connected to the second semiconductor layer 12. The direction perpendicular to the substrate 102 is designated as the Z axis direction. One of the axes perpendicular to the Z axis direction is designated as the X axis direction. The direction perpendicular to the Z axis direction and the X axis direction is designated as the Y axis direction. The constituents of the semiconductor parts 101 will be explained in more detail below with reference to FIG. 2.

The step of providing a structure body 210 may include a step of forming a semiconductor structure body 10 on the substrate 102. For the substrate 102, an insulating substrate such as sapphire or spinel ($MgAl_2O_4$), or a combination thereof can be used. For the substrate 102, a conducting substrate comprising or composed of, for example, SiC (including 6H, 4H, and 3C), ZnS, ZnO, GaAs, Si, or the like, or a combination thereof may alternatively be used.

A semiconductor structure body 10 includes a nitride semiconductor such as $In_xAl_yGa_{1-x-y}N$ ($0 \leq x$, $0 \leq y$, $x+y \leq 1$). The semiconductor structure body 10 has a first semiconductor layer 11, a second semiconductor layer 12, and an active layer 13 positioned between the first semiconductor layer 11 and the second semiconductor layer 12. For example, the first semiconductor layer 11 is an n-side semiconductor layer which includes an n-type semiconductor layer, and the second semiconductor layer 12 is a p-side semiconductor layer which includes a p-type semiconductor layer. The active layer 13 is an emission layer that emits light. For example, the active layer 13 can be a multiple quantum well structure in which a plurality of barrier layers and a plurality of well layers are alternately stacked.

For example, a first semiconductor layer 11, an active layer 13, and a second semiconductor layer 12 are successively formed on a substrate 102 by MOCVD (metalorganic chemical vapor deposition).

A semiconductor structure body 10 has a first face 10*fa* and a second face 10*fb* located opposite the first face 10*fa*. Furthermore, a groove 80 created in the semiconductor structure body 10 provides the semiconductor structure body 10 with a lateral face 10*c* exposed to the groove 80. A groove 80 is formed by removing a portion of the semiconductor structure body 10 from the second semiconductor layer 12 side. As shown in FIG. 2, a groove 80 is formed so as not to reach the first face A groove 80 may be formed to reach the first face 10*fa*. The semiconductor structure body 10 can be removed by dry etching such as reactive ion etching (RIE) or wet etching.

The second face 10*fb* of a semiconductor structure body 10 has a first portion 10*fb*1 and a second portion 10*fb*2. The first portion 10*fb*1 is the surface of the second semiconductor layer 12 in the second face 10*fb* (the upper face of the second semiconductor layer 12 in FIG. 2). The second portion 10*fb*2 is the surface of the first semiconductor layer 11 in the second face 10*fb* (the upper face of the first semiconductor layer 11 in FIG. 2). The second face 10*fb* of the semiconductor structure body 10 also has faces that connect the first portion 10*fb*1 and the second portion 10*fb*2, and the faces that connect the first portion 10*fb*1 and the second portion 10*fb*2 are made up of the lateral faces of the first semiconductor layer 11, the lateral faces of the second semiconductor layer 12, and the lateral faces of the active layer 13.

The step of providing a structure body 210 further includes a step of forming a current diffusion layer 15. The current diffusion layer 15 can be formed by, for example, sputtering, vapor deposition, or the like. The current diffusion layer 15 is disposed on the first portion 10*fb*1 of the second face 10*fb* of the semiconductor structure body 10. The current diffusion layer 15 has conductivity. For the material for the current diffusion layer 15, for example, an oxide film, such as ITO (indium tin oxide), AZO (aluminum zinc oxide), IZO (indium zinc oxide), or $Ga_2O_3$ can be used. The current diffusion layer 15 diffuses the current supplied across the second electrode 32 described layer in the direction of plane of the second semiconductor layer 12.

The step of providing a structure body 210 further includes a step of forming a first electrode 31 and a second electrode 32. The first electrode 31 and the second electrode 32 can be formed by, for example, sputtering, vapor deposition, CVD (chemical vapor deposition) or the like. The first electrode 31 is disposed on the second portion 10*fb*2 of the second face 10*fb* of the semiconductor structure body 10 to be electrically connected to the first semiconductor layer 11. The second electrode 32 is disposed on the current diffusion layer 15 to be electrically connected to the second semiconductor layer 12 via the current diffusion layer 15. The current diffusion layer 15 alone may be used as the second electrode 32. The first electrode 31 and the second electrode 32 can be, for example, a single layer of a metal, such as Ti, Rh, Au, Pt, Al, Ag, Rh, or Ru, or a multilayer structure body that includes at least two of these metal layers.

The step of providing a structure body 210 further includes a step of forming a first reflecting layer 40. The first reflecting layer 40 can be formed by, for example, sputtering, vapor deposition, CVD, ALD (atomic layer deposition), or the like. The first reflecting layer 40 covers the second face 10*fb* of the semiconductor structure body 10, the current diffusion layer 15, the first electrode 31, and the second electrode 32.

The first reflecting layer 40 has high reflectivity with respect to the light from the active layer 13. The first reflecting layer 40 has, for example, 70% or higher, preferably 80% or higher, more preferably 90% or higher reflectivity with respect to the peak wavelength of the light from the active layer 13. The first reflecting layer 40 includes, for example, a dielectric multilayer film. The dielectric multilayer film includes, for example, silicon oxide ($SiO_2$) layers and niobium oxide ($Nb_2O_5$) layers that are alternately stacked. The first reflecting layer 40 is preferably formed, for example, by depositing a $SiO_2$ layer of 100 nm to 500 nm in thickness, followed by forming two to six pairs of an $Nb_2O_5$ layer of 10 nm to 100 nm and an $SiO_2$ layer of 10 nm to 100 nm in thickness. Setting the thickness of each layer of the first reflecting layer 40 and the number of layers as these can produce a first reflecting layer 40 having high reflectivity with respect to the light from the active layer 13. For example, the first reflecting layer 40 can be formed by depositing a $SiO_2$ layer of 300 nm in thickness followed by forming thereon three pairs of a $Nb_2O_5$ layer of 52 nm in thickness and a $SiO_2$ layer of 83 nm in thickness. For the first reflecting layer 40, materials, such as titanium oxide ($TiO_2$), zirconium oxide ($ZrO_2$), aluminum oxide ($Al_2O_3$), aluminum nitride (AlN), and the like can be used.

The step of providing a structure body 210 further includes a step of forming a second reflecting layer 50. The second reflecting layer 50 can be formed, for example, by sputtering, vapor deposition, CVD, or the like. The second reflecting layer 50 is disposed on the surface of the first reflecting layer 40 (the upper face of the first reflecting layer 40 in FIG. 2). The second reflecting layer 50 is, for example, a metal layer. The second reflecting layer 50 includes, for example, an Al layer, Ti layer, or a multilayer structure body of these.

The step of providing a structure body 210 further includes a step of forming a first insulating film 61. The first insulating film 61 can be formed by, for example, sputtering, vapor deposition, CVD, ALD or the like. The first insulating film 61 covers the lateral faces 10*c* and the second face 10*fb* of the semiconductor structure body 10. The first insulating film 61 also covers the upper face of the first semiconductor layer 11 exposed at the bottom of the groove 80. Furthermore, the first insulating film 61 covers the current diffusion layer 15 disposed on the second face 10*fb* side, the first electrode 31, the second electrode 32, the first reflecting layer 40, and second reflecting layer 50. The first insulating film 61 has transmissivity with respect to the light from the active layer 13. The first insulating film 61 is, for example, a silicon oxide film. In the example shown in FIG. 2, the first insulating film 61 is formed in the state in which the first insulating film 61 has an opening for exposing the first electrode 31 and an opening for exposing the second electrode 32.

The step of providing a structure body 210 further includes a step of creating in the first insulating film 61 a first opening 41 for exposing a portion of the first electrode 31 from the first insulating film 61 and a second opening 42 for exposing a portion of the second electrode 32 from the first insulating film 61. The first opening 41 is created at the position that overlaps the opening in the first reflecting layer 40 for exposing the first electrode 31. The second opening 42 is created at the position that overlaps the opening in the first reflecting layer 40 for exposing the second electrode 32.

The step of providing a structure body 210 further includes a step of forming a first conducting member 71 and a second conducting member 72. The first conducting member 71 and the second conducting member 72 are disposed on the surface of the first insulating film 61 (the upper face of the first insulating film 61 in FIG. 2) to be isolated from one another.

A portion of the first conducting member 71 is electrically connected to the first electrode 31 through the first opening 41. A portion of the second conducting member 72 is electrically connected to the second electrode 32 through the second opening 42. The first conducting member 71 and the second conducting member 72 include, for example, a titanium (Ti) layer, rhodium (Rh) layer, ruthenium (Ru) layer, platinum (Pt) layer, gold (Au) layer, or a multilayer structure body that includes at least two of these metal layers.

As shown in FIG. 2, the structure body 210 includes a first terminal P1. The first terminal P1 is electrically connected to a semiconductor structure body 10. In this example, the first terminal P1 is disposed on the second conducting member 72, and is electrically connected to the first semiconductor layer 11 via the second conducting member 72 and the second electrode 32.

The structure body 210 includes a second terminal P2. The second terminal P2 is electrically connected to a semiconductor structure body 10. In this example, the second terminal P2 is disposed on the first conducting member 71, and is electrically connected to the first semiconductor layer 11 via the first conducting member 71 and the first electrode 31.

The first terminal P1 and the second terminal P2 function as the electrodes of a semiconductor part 101, for example. When a voltage is applied across the first terminal P1 and the second terminal P2, the emission layer 13 emits light. The material for the first terminal P1 and the second terminal P2 is, for example, gold (Au) or copper (Cu).

Figure 11:
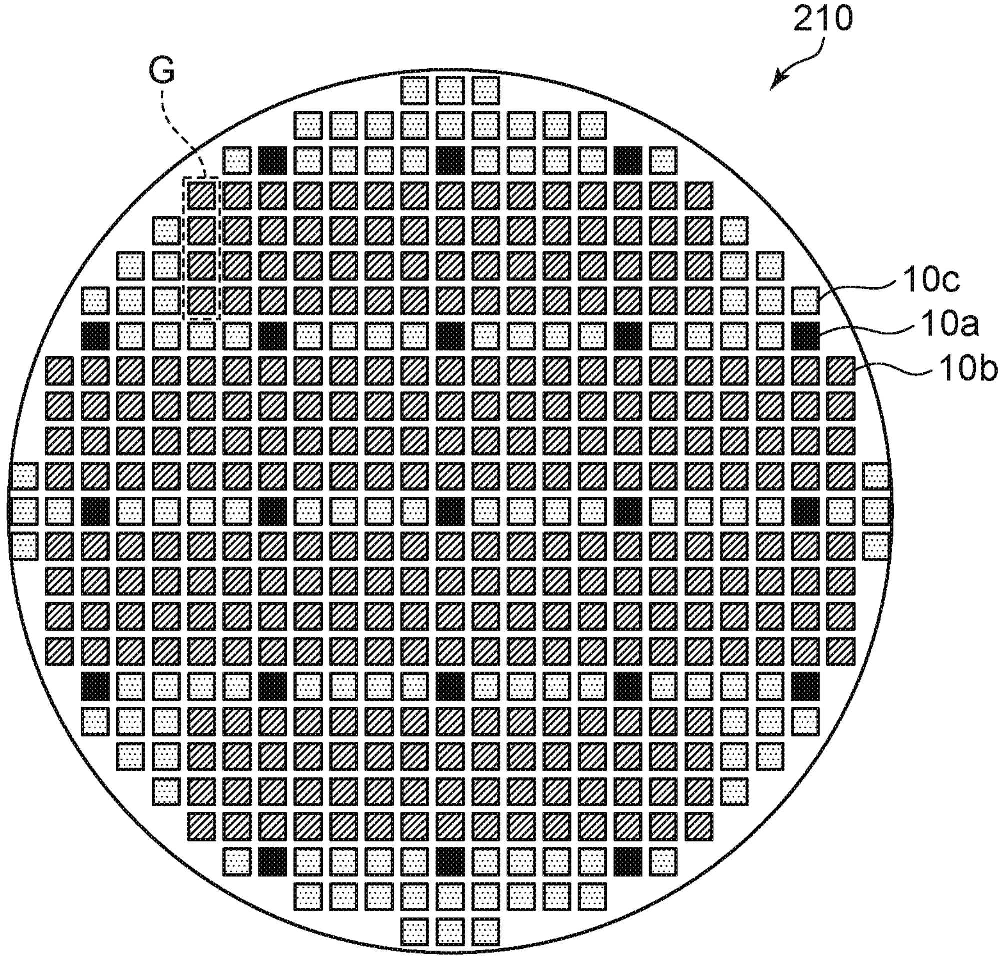
FIG. 11 is a schematic top view showing an example of an arrangement of semiconductor parts.

For example, as shown in FIG. 11 described later, a plurality of semiconductor parts 101 are arranged in a matrix on the substrate 102 when viewed from above. FIG. 3 shows 16 pieces of semiconductor parts 101 arranged in four rows and four columns as some of the semiconductor parts 101 arranged in a matrix. The shortest distance between two adjacent semiconductor parts 101 is, for example, 1 μm to 10 μm.

The semiconductor parts 101 are arranged so as to line up the first terminals P1 and the second terminals P2 successively along the X axis direction. In this state, two adjacent semiconductor parts 101 in either the X axis direction or the Y axis direction are not electrically connected. Accordingly, in the case of evaluating the electrical properties of the semiconductor parts 101, it is necessary to bring test probes into contact with the first terminal P1 and the second terminal P2 of each semiconductor part 101. As such, the electrical evaluation of the plurality of semiconductor parts 101 needs to be done individually.

Figure 4:
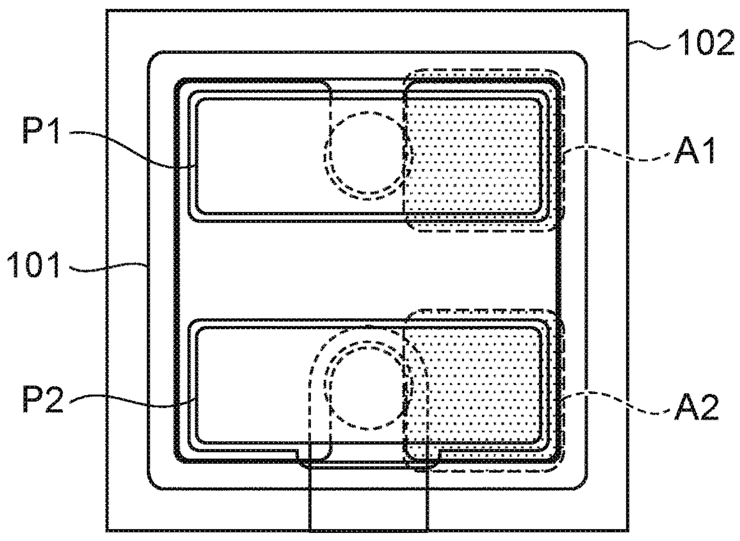
FIG. 4 is a diagram showing examples of regions with which a testing device can be brought into contact.

FIG. 4 is a diagram showing examples of regions in a semiconductor part 101 with which a testing device can be brought into contact.

A semiconductor part 101 is quadrangular when viewed from above. One side of the semiconductor part 101 is, for example, 10 μm to 50 μm. Accordingly, the area of the semiconductor part 101 when viewed from above is, for example, 100 $\mu m^2$ to 2500 $\mu m^2$. For example, the semiconductor part 101 is a quadrangle, one side being 50 μm and the area being 2500 $\mu m^2$ when viewed from above. In the top view, both the area of the first terminal P1 and the area of the second terminal P2 are smaller than the area of the semiconductor part 101. Furthermore, in some cases, the first terminal P1 and the second terminal P2 each have a recess that corresponds to an opening created in the first insulating film 61, for example, making it difficult to accurately bring the tips of a testing device into contact with the recessed portions of the terminals. For this reason, the portions of the upper faces of the first terminal P1 and the second terminal P2 used for the contact with the testing device preferably exclude the recessed regions. The regions of the upper faces of the first terminal P1 and the second terminal P2 with which a testing device is brought into contact are, as shown in FIG. 4 for example, a region A1 of the first terminal P1 and a region A2 of the second terminal P2. The area of the region A1 of the first terminal P1 is about one half of the area of the first terminal P1. The area of the region A2 of the second terminal P2 is about one half of the area of the second terminal P2. Thus, it is difficult to accurately bring the tips of the testing device into contact with the first terminal P1 and the second terminal P2. The smaller the size of the semiconductor part 101, the more prominent the effect of this becomes.

In this embodiment, the electrical properties of a plurality of semiconductor parts 101 included in the structure body 210 described above are evaluated by the method described below.

Figure 5:
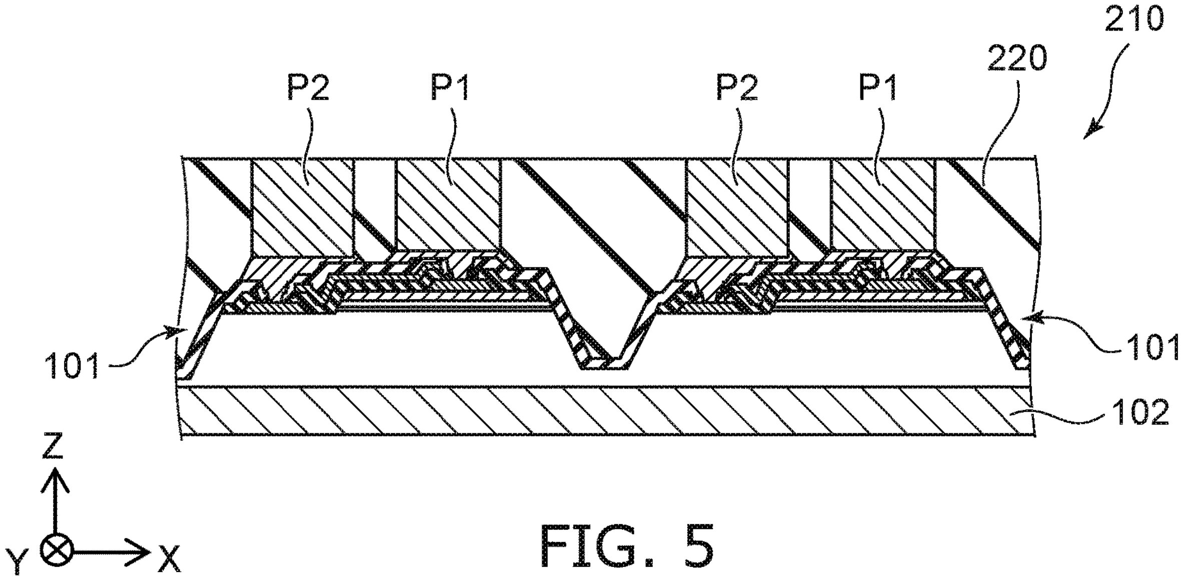
FIG. 5 is a schematic cross-sectional view explaining the example of a method of manufacturing a light emitting device according to the embodiment.

As shown in FIG. 1 and FIG. 5, a step of forming an insulating member 220 (ST102) is conducted.

An insulating member is formed to cover the semiconductor parts 101, the first terminals P1, and the second terminals P2. The insulating member is, for example, a resist. Subsequent to forming the insulating member, the upper faces of the first terminals P1 and the upper faces of the second terminals P2 are exposed from the insulating member by removing a part of the insulating member, a part of the first terminals P1, and a part of the second terminals P2. FIG. 5 is a schematic cross-sectional view explaining an example of a method of manufacturing a light emitting device. As shown in FIG. 5, this exposes the upper faces of the first terminals P1 and the upper faces of the second terminals P2 from the insulating member 220 that covers the upper face of the structure body 210. The surfaces of the first terminals P1 and the surfaces of the second terminals P2 are exposed by, for example, polishing after embedding the first terminals P1 and the second terminals P2 in the insulating member. This increases the flatness of the upper faces of the first terminals P1 and the upper faces of the second terminals P2 as compared to the case of simply forming the first terminals and the second terminals. This thus can enhance the bondability of the first terminals P1 and the second terminals P2 when used in bonding with a mounting substrate, for example.

Figure 6:
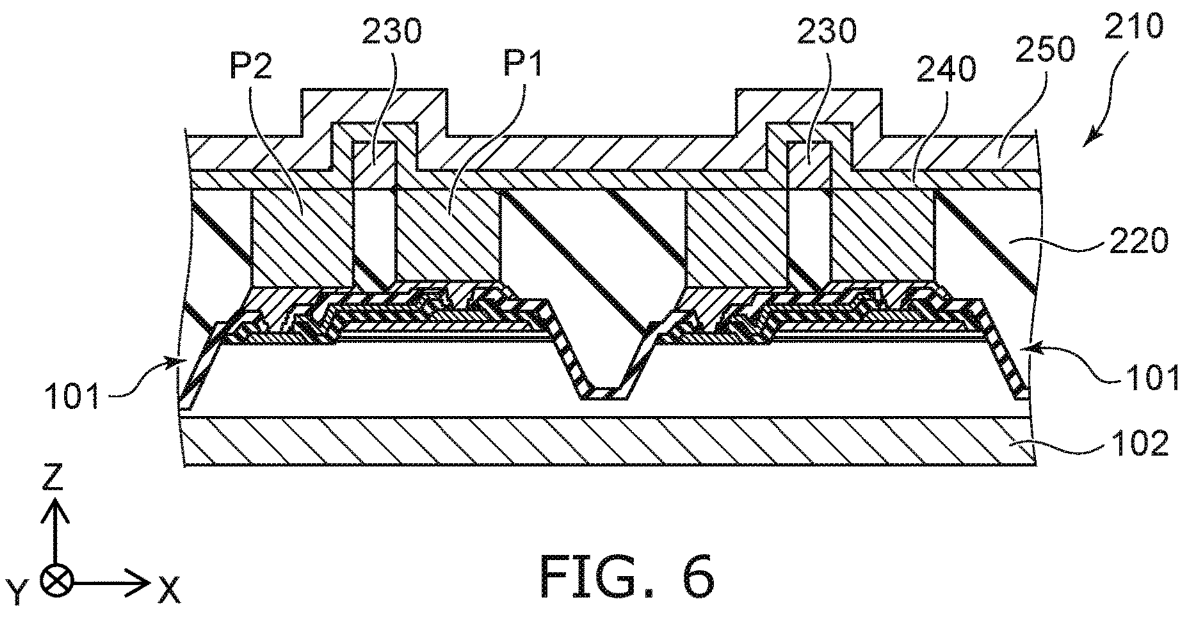
FIG. 6 is a schematic cross-sectional view explaining the example of a method of manufacturing a light emitting device according to the embodiment.

Next, as shown in FIG. 1 and FIG. 6, a step of forming wiring (ST103) is conducted.

Figure 7:
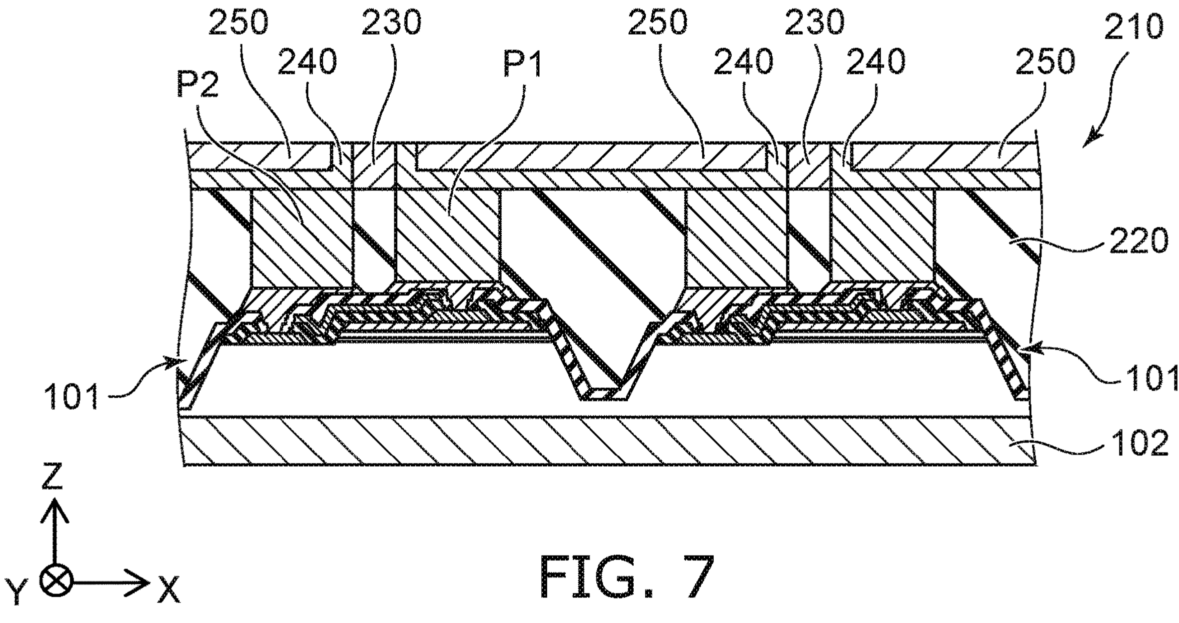
FIG. 7 is a schematic cross-sectional view explaining the example of a method of manufacturing a light emitting device according to the embodiment.

Wiring is formed by the process described below. FIG. 6 and FIG. 7 are schematic cross-sectional views explaining the example of the method of manufacturing a light emitting device.

A resist 230 is formed on the insulating member 220 located between the upper face of the first terminal P1 and the upper face of the second terminal P2 of each semiconductor part 101. In this manner, a resist 230 is formed in the region between the first terminal P1 and the second terminal P2 of each of the semiconductor parts 101 adjacent in the X axis direction.

Subsequent to forming the resist 230, a seed layer 240 is formed to continuously cover the semiconductor parts 101 arranged along the X axis direction. The seed layer 240 is formed to cover the first terminals P1, the second terminals P2, and the resist 230 of semiconductor parts 101 in the X axis direction. At this time, the first terminal P1 and the second terminal P2 of each semiconductor part 101 are short circuited and connected. Furthermore, a plurality of semiconductor parts 101 arranged in the X axis direction are electrically connected by the seed layer 240. The seed layer 240 is formed, for example, by sputtering or plating. When viewed from above, the width of the seed layer 240 in the Y axis direction is roughly the same as the widths of the resist 230, the first terminals P1, and the second terminals P2 in the Y axis direction. In the Y axis direction, no seed layer 240 is formed between two adjacent semiconductor parts 101. For example, the material for the seed layer 240 includes or is titanium (Ti), nickel (Ni), platinum (Pt), or the like, or a combination thereof.

Subsequent to forming the seed layer 240, a conducting layer 250 is formed on the seed layer 240. The conducting layer 250 has only to be formed of a conductive material. The conducting layer 250 is formed by, for example, sputtering, plating, or the like. For example, the material for the conducting layer 250 includes or is gold (Au), copper (Cu), or the like, or a combination thereof. This completes the structure body 210 shown in FIG. 6.

Next, as shown in FIG. 1 and FIG. 7, a step of removing the seed layer 240 and the conducting layer 250 (ST104) is conducted. Specifically, by removing portions of the seed layer 240 and the conducting layer 250 that cover the resist 230 shown in FIG. 6, the resist 230 is exposed from the seed layer 240 and the conducting layer 250 as shown in FIG. 7. This process also exposes the seed layer 240 from the conducting layer 250 between the resist 230 and the conducting layer 250. The removal of the seed layer 240 and the conducting layer 250 is achieved by, for example, grinding, polishing, or the like. A portion of the resist 230 may be removed when removing the seed layer 240 and the conducting layer 250.

Figure 8:
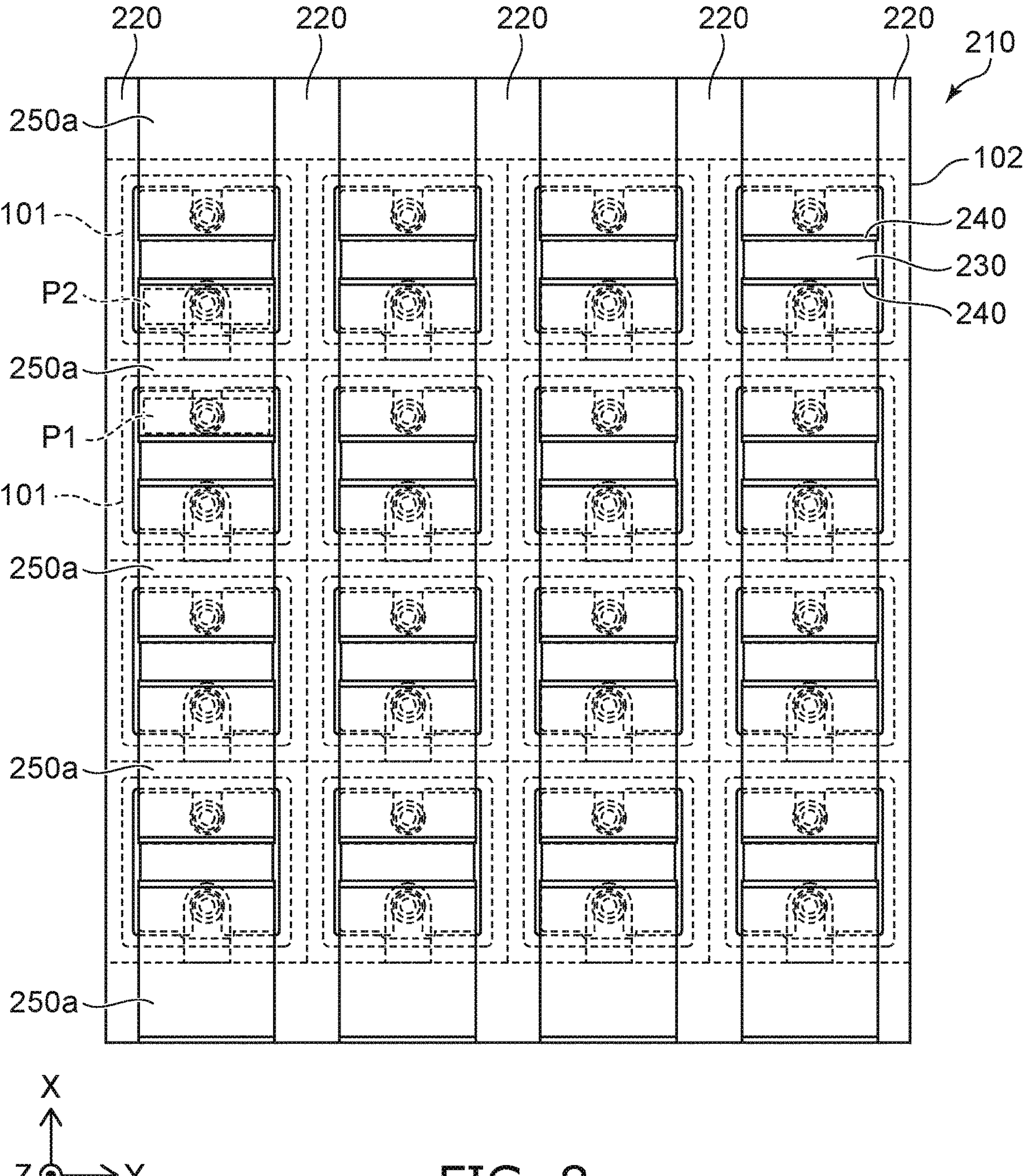
FIG. 8 is a schematic top view showing a portion of the structure body.

FIG. 8 is a schematic top view showing a portion of the structure body 210 subsequent to the removal of the seed layer 240 and the conducting layer 250 shown in FIG. 7.

As shown in FIG. 8, a plurality of semiconductor parts 101 arranged along the X axis direction are electrically connected by wiring 250*a*. The wiring 250*a* is formed by the step of removing the seed layer 240 and the conducting layer 250 shown in FIG. 7. Accordingly, a plurality of semiconductor parts 101 arranged along the X axis direction are connected serially. On the other hand, in the Y axis direction, no seed layer 240 or conducting layer 250 is formed between the semiconductor parts 101. As such, the semiconductor parts 101 adjacent in the Y axis direction are not electrically connected.

Figure 9:
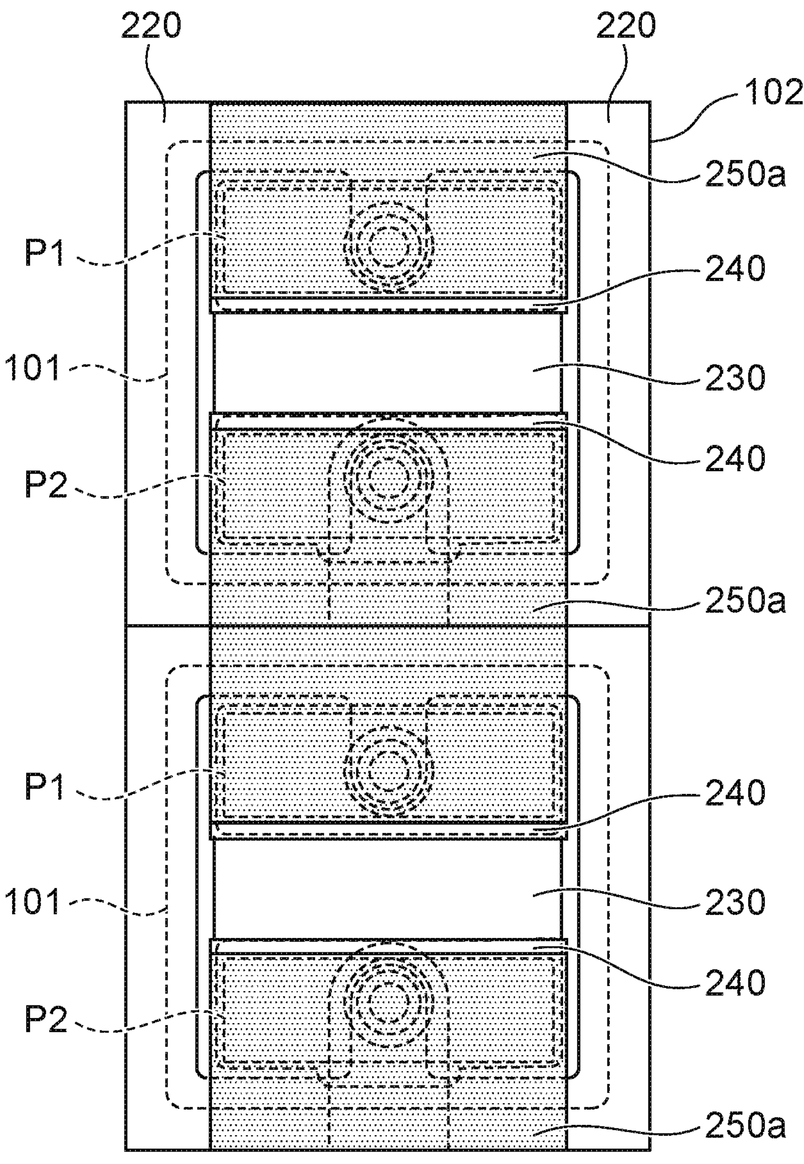
FIG. 9 is a diagram showing examples of regions with which a testing device can be brought into contact.

FIG. 9 shows examples of regions with which a testing device is brought into contact in the semiconductor parts 101 shown in FIG. 7 and FIG. 8. As shown in FIG. 8 and FIG. 9, in the X axis direction, the first terminal P1 of a semiconductor part 101 and the second terminal P2 of another semiconductor part 101 that is adjacent thereto in the X axis direction are electrically connected by wiring 250*a*. The area of the wiring 250*a* per location is larger than the area of the first terminal P1 or the second terminal P2 when viewed from above. When viewed from above, the area of the wiring 250*a* per location is two to five times the area of a first terminal P1. Bringing the tips of the testing device into contact with the wiring 250*a* can evaluate the electrical property of a semiconductor part 101. As compared to the region A1 and A2 with which the tips of the testing device are brought into contact explained with reference to FIG. 4, the area of the wiring 250*a* at each location is several times larger, making it easy to bring the tips of the testing device into contact therewith.

Figure 10:
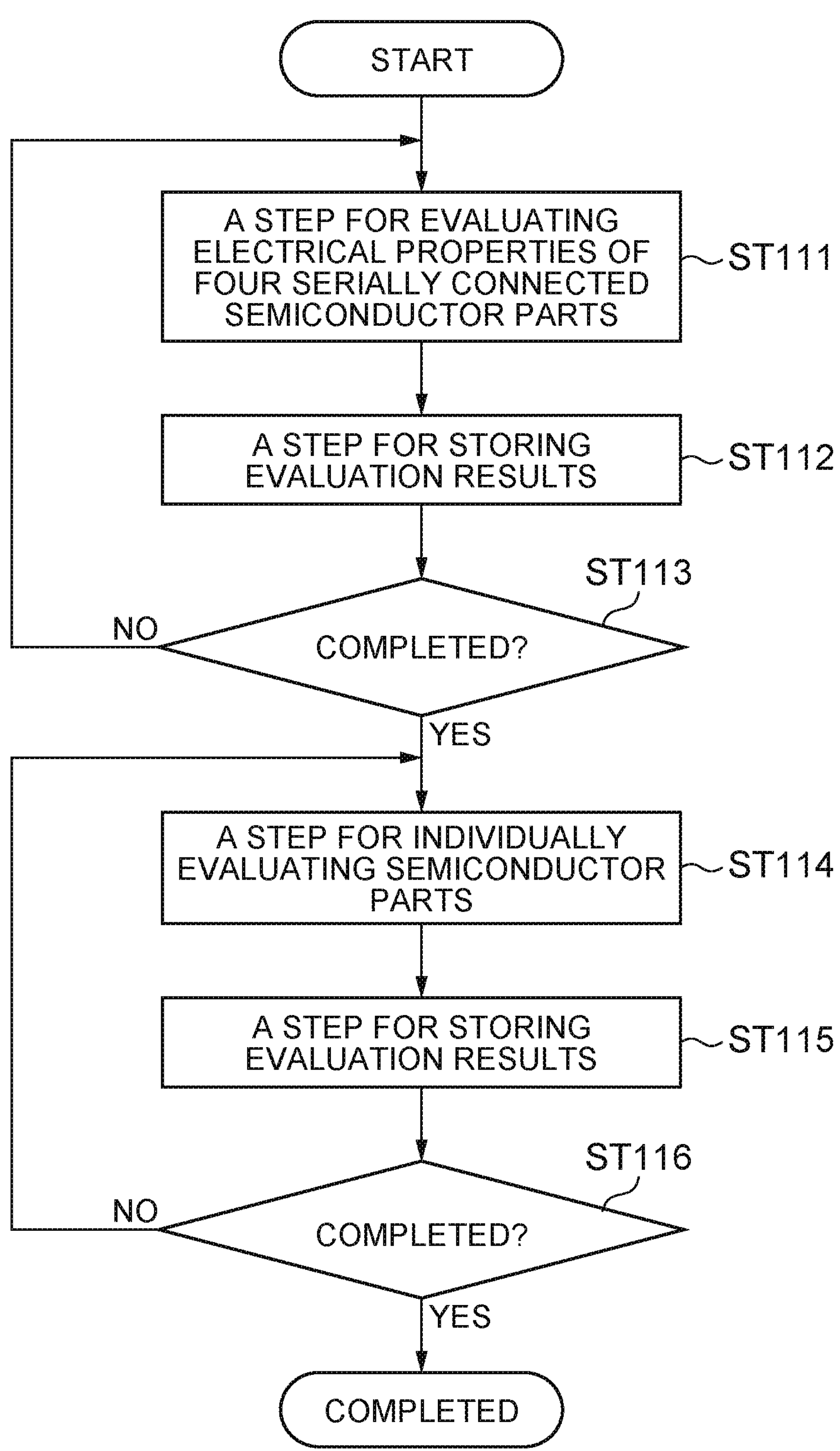
FIG. 10 is a sub-flowchart showing an example of an electrical characteristic evaluation process.

Next, as shown in FIG. 1 and FIG. 10, the electrical property of each semiconductor part 101 is evaluated (ST105). FIG. 10 is a sub-flowchart showing an example of an electrical property evaluation process. The electrical properties of the semiconductor parts 101 are evaluated by using a testing device. The testing device, for example, is a probe device PB which includes the probe needles PB1 and PB2 shown in FIG. 12 described later. The testing device will be explained as a probe device PB below. Allowing the probe needles PB1 and PB2 of the probe device PB to come into contact with the wiring 250*a* at two locations can evaluate the electrical properties of one, two, or more semiconductor parts 101 that are electrically connected between the PB1 and PB2.

As shown in FIG. 10, the probe device PB evaluates the electrical properties of, for example, four serially connected semiconductor parts 101 (ST111). The four serially connected semiconductor parts 101 are managed as a group G, for example. The quantity of semiconductor parts 101 included in a group G is not limited to four. The quantity of semiconductor parts 10 included in a group G may be set as, for example, three to fifty.

FIG. 11 is a diagram showing an example of an arrangement of the semiconductor parts 101 included in the structure body 210.

The semiconductor parts 101 are classified into three types, 10*a*, 10*b*, and 10*c*. The type 10*a* semiconductor parts are those in a TEG (test element group). The type semiconductor prats are evaluated as part of a group G, and the type 10*c* semiconductor parts are evaluated individually. The type 10*a* as TEG of semiconductor parts are used for confirming the positions of the semiconductor parts 101 on the structure body 210 when evaluating the electrical properties of semiconductor parts 101. In FIG. 11, the semiconductor parts 101 set as type 10*a* are shown as solid black squares. The type 10*b* semiconductor parts 101 are, for example, those among a plurality of semiconductor parts 101 serially connected that are used in the process of mounting on a mounting substrate described later. The type 10*b* semiconductor parts 101 are shown as squares with diagonal lines. The type 10*c* semiconductor parts 101 are those that will be used, for example, to replace any semiconductor part 101 which has been determined to be failed with one determined to be passed as described later. The type 10*c* semiconductor parts 101 are shown as squares with dot hatching. The arrangement, the types, the order of evaluation of the semiconductor parts 101 on the structure body 210 are prestored in the probe device PB, for example. In FIG. 11, certain constituents such as the wiring 250*a* that connects the semiconductor parts 101 are not shown in order to make the arrangement and the types of the semiconductor parts 101 easier to understand. The same applies to FIG. 13 and FIG. 15 described later.

Figure 12:
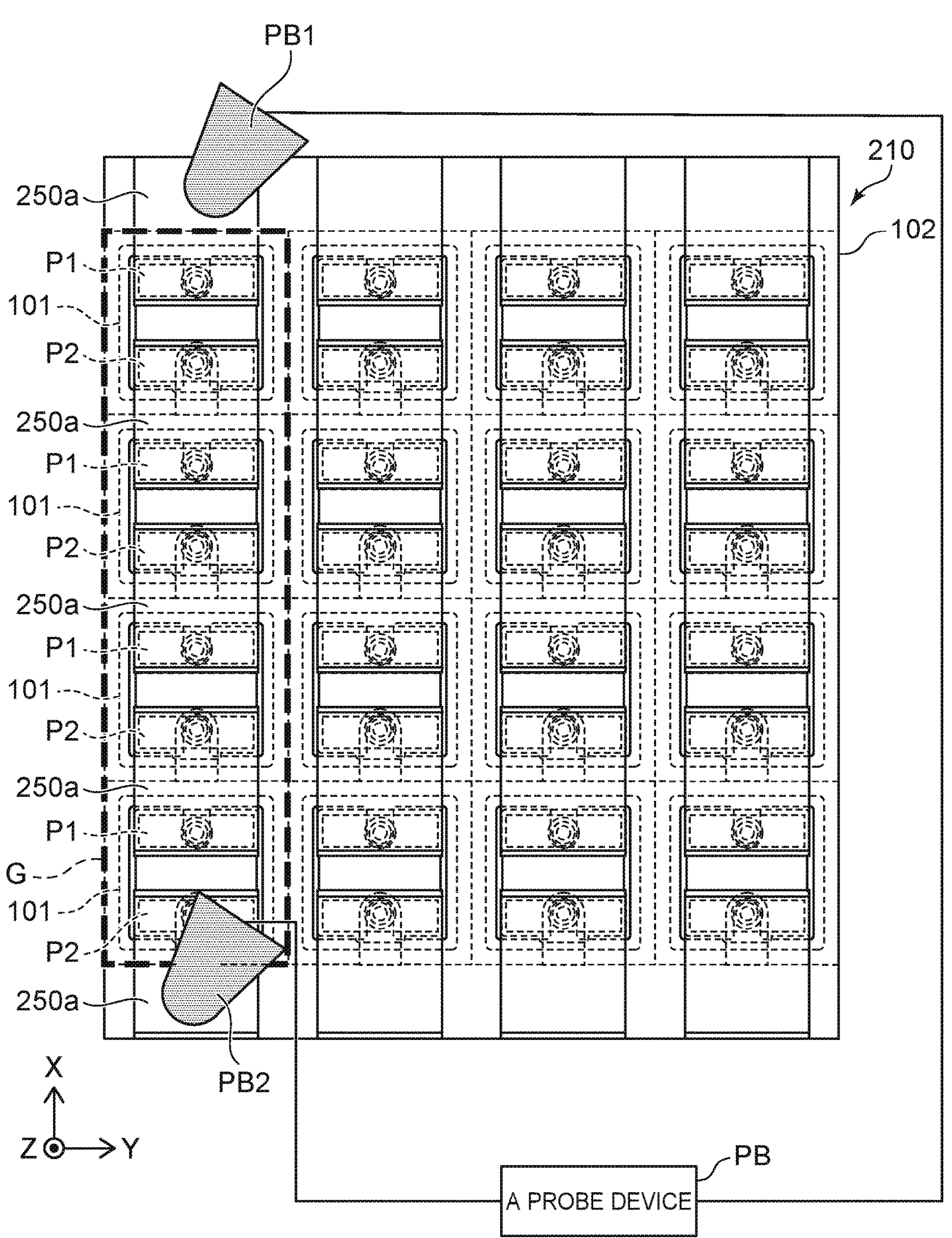
FIG. 12 is a diagram explaining an example of an electrical property evaluation.

FIG. 12 is a diagram explaining the case of evaluating the electrical properties of four semiconductor parts 101 included in a group G.

As shown in FIG. 12, the tip of a probe needle PB1 of a probe device PB is brought into contact with the wiring 250*a* at the uppermost location, and the tip of a probe needle PB2 is brought into contact with the wiring 250*a* at the lowermost location among the wirings 250*a* provided at multiple locations to serially connect the semiconductor parts 101 of a group G in the X axis direction. This makes it possible to evaluate the electrical properties of the four serially connected semiconductor parts 101 in the group G. In other words, the four semiconductor parts 101 can be evaluated at once. For example, the evaluation results are stored in the predetermined memory of the probe device PB so as to correlate the results with the positions of the semiconductor parts 101 in the group G (ST112). The evaluation results are, for example, passed if the predetermined standard is satisfied, and failed if the standard is not satisfied. The standard here is, for example, whether or not each semiconductor part 101 emitted light with predetermined brightness when a current of a predetermined value was applied across the probe needles PB1 and PB2.

Subsequently, whether or not the evaluation of the electrical properties of groups G has been completed is determined (ST113). The probe device PB conducts the evaluation of electrical properties of groups G in the predetermined order, and determines whether or not the evaluation of all groups G has been concluded. The determination made is YES if the measurement of all groups G has been completed, and NO if there remains a group G yet to be measured. If determined to be NO in ST113, the probe device PB moves the probe needles PB1 and PB2 to the next group G to be evaluated and evaluates the electrical properties of the group G. In this manner, the probe device PB can obtain the electrical property evaluation results per group G.

If determined to be YES in ST113, the four semiconductor parts 101 in any group which has been determined to be failed and the type 10*c* semiconductor parts 101 are individually evaluated (ST114).

Figure 13:
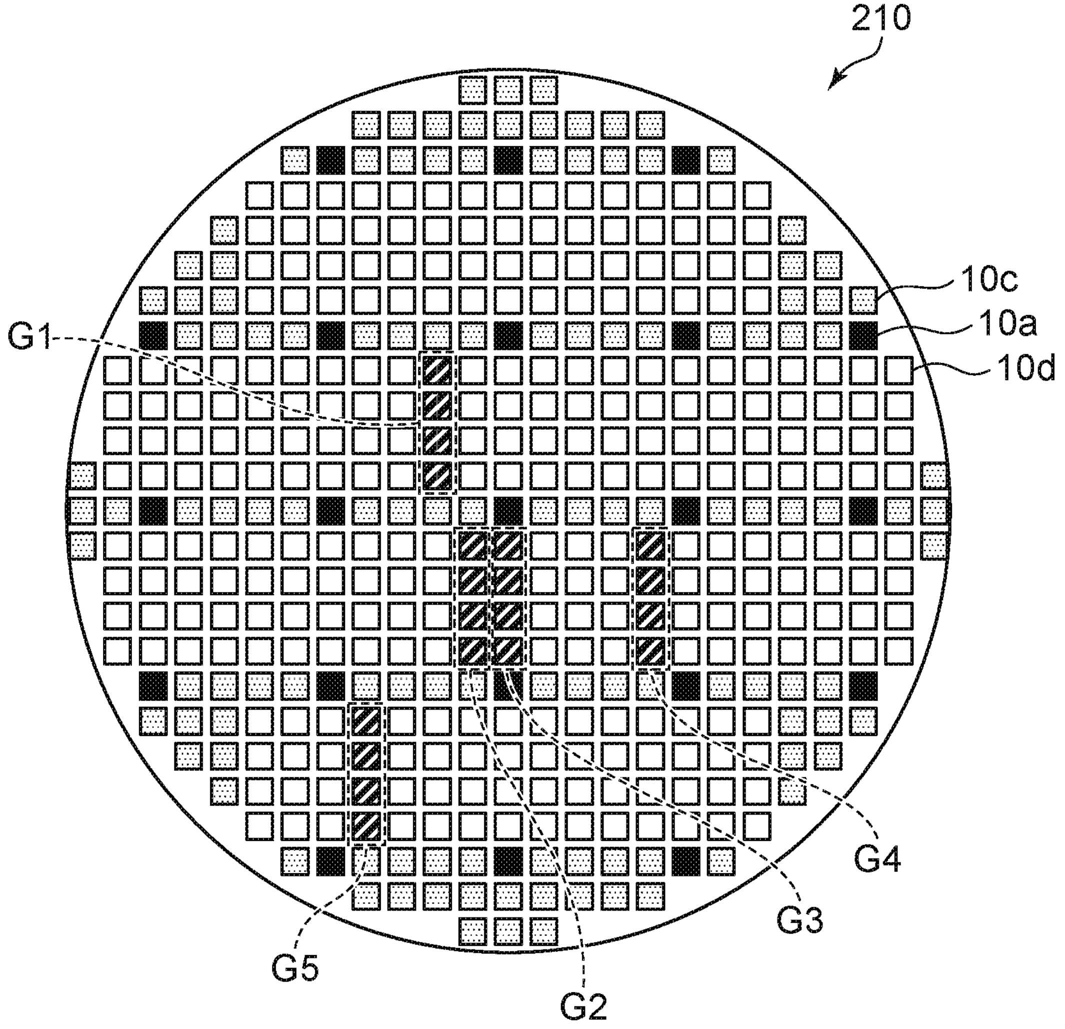
FIG. 13 is a diagram showing examples of results of group by group evaluation of electrical property.

FIG. 13 shows the case in which groups G1 to G5 were determined to be failed, for example. If the evaluation results of groups G1 to G5 were failed, for example, the probe needles PB1 and PB2 are successively brought into contact with the wiring 250*a* at two adjacent locations in each of the groups G1 to G5. This allows the probe device PB to evaluate the electrical property of each semiconductor part 101 in each of the groups G1 to G5 individually. In addition, the probe device PB also individually evaluates the electrical properties of the semiconductor parts 101 classified as type 10*c*. For example, the probe device PB evaluates the electrical properties of the semiconductor parts 101 classified as type 10*c* subsequent or prior to evaluating the electrical properties of the semiconductor parts 101 in the groups G determined to be failed.

Figure 14:
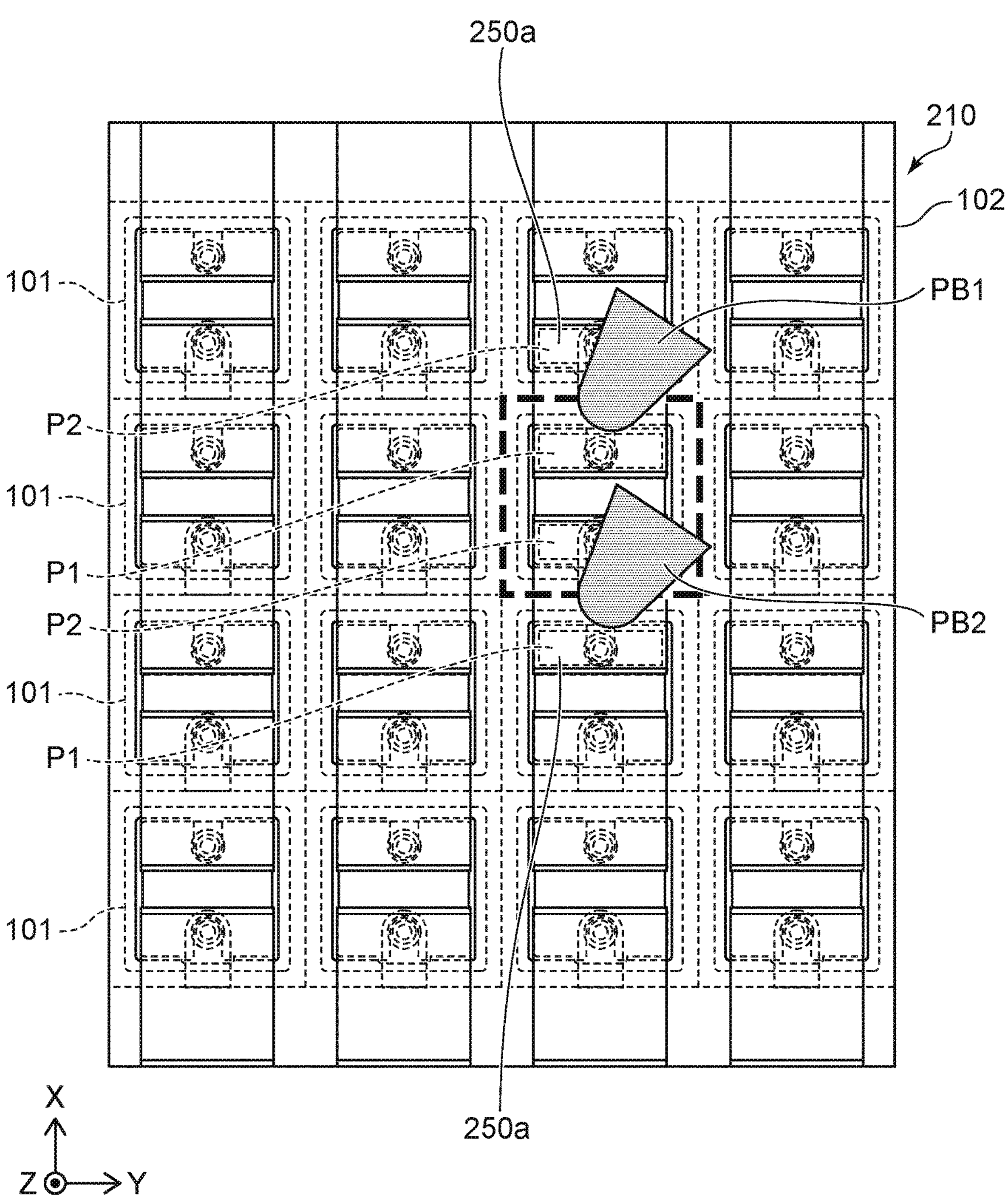
FIG. 14 is a diagram explaining an example of an electrical property evaluation.

FIG. 14 is a diagram explaining the case of individually evaluating the electrical properties of the semiconductor parts 101.

In the case of individually evaluating the electrical properties of the semiconductor parts 101, the probe device PB brings the probe needles PB1 and PB2 into contact with the wiring 250*a* formed on the first terminal P1 and the wiring 250*a* formed on the second terminal P2 of the semiconductor part 101 to be evaluated. Accordingly, the electrical property evaluation of the semiconductor part 101 is performed.

Then the probe device PB stores the evaluation results (ST115). The evaluation results are stored to be correlated with the positions of the evaluated semiconductor parts 101. In this manner, the individual electrical property evaluation results of the semiconductor parts 101 are obtained.

Next, the probe device PB determines whether or not individual evaluation of electrical properties has been completed (ST116). If determined to be NO in ST116, the probe device PB moves the probe needles PB1 and PB2 to the two wirings 250*a* formed on the next semiconductor part 101 to evaluate the electrical property of the semiconductor part 101. If determined to be YES in the step ST116, it ends the process. In this manner, the electrical property evaluation results of the semiconductor parts 101 in each group which was determined to be failed and the semiconductor parts 101 classified for individual evaluation can be individually obtained. In combination with the evaluation results obtained by the group by group evaluation in the step ST112 described earlier, the electrical property evaluation results of the semiconductor parts 101 included in the structure body 210 can be obtained.

Figure 15:
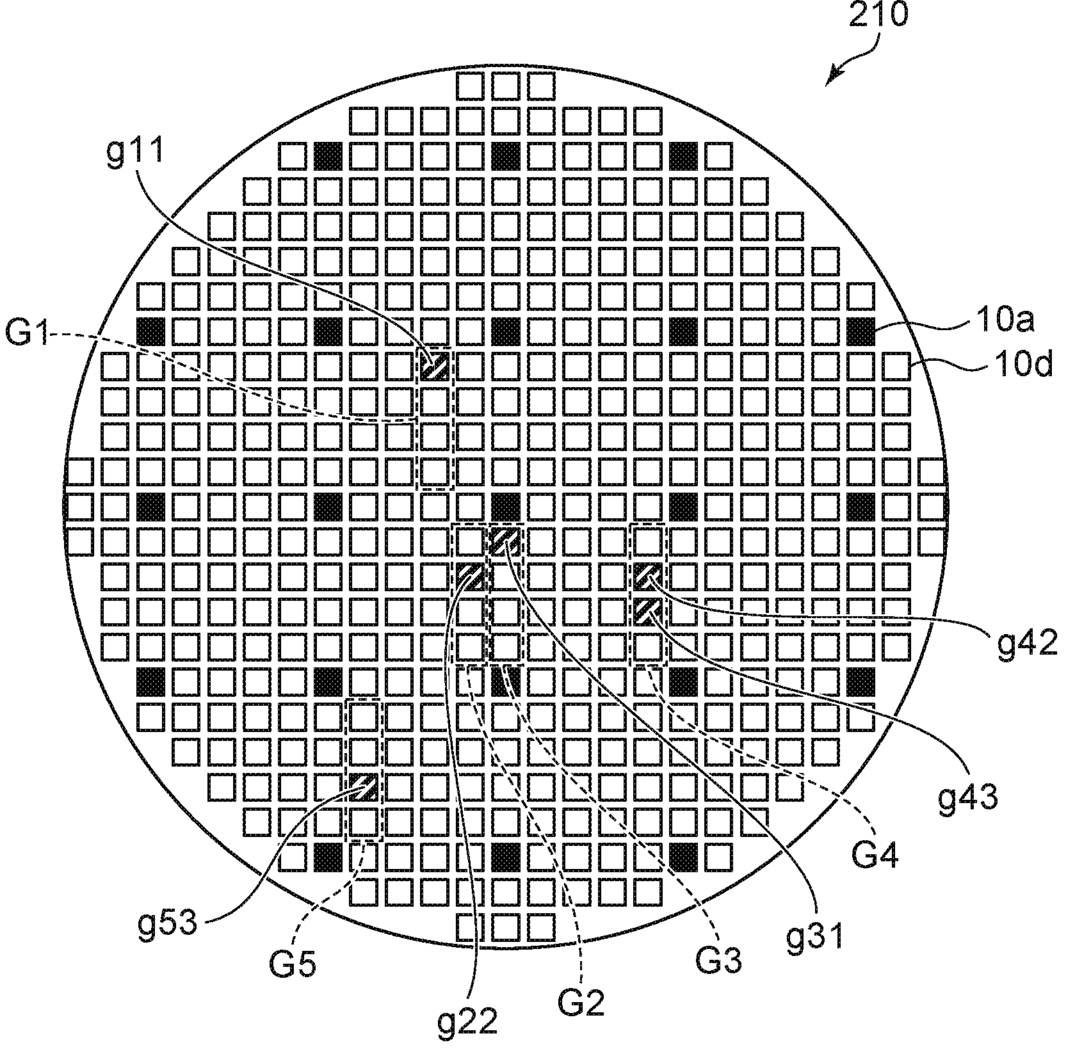
FIG. 15 is a diagram showing examples of individual electrical property evaluation results.

FIG. 15 is a diagram showing examples of individual electrical property evaluation results.

FIG. 15 shows semiconductor parts 10*d* which were those determined to be passed, and semiconductor parts g11, g22, g31, g42, g43, and g53 which were those determined to be failed. In other words, it shows that the evaluation results of the semiconductor parts g11, g22, g31, g42, g43, and g53 among those in the groups G1 to G5 were determined to be failed. Furthermore, it shows that all of the semiconductor parts 101 classified as type 10*c* were determined to be passed.

Subsequent to the completion of the evaluation of the electrical properties of the semiconductor parts 101, the insulating member and the wiring are removed (ST106) as shown in FIG. 1. For example, by polishing the upper face side of the structure body 210, the resist 230, the seed layer 240, and the conducting layer 250 are removed. This achieves the state of the structure body 210 in which the upper faces of the first terminals P1 and the second terminals P2 are exposed from the insulating member 220. In other words, the structure body 210 achieves the same state as that shown in FIG. 5. Then the insulating member 220 is further removed by using, for example, a stripper. This reverts the structure body 210 to the state shown in FIG. 2. In order to reduce the size of the semiconductor parts 101, the first terminals P1 and the second terminals P2 may be further removed from the structure body 210.

Then as shown in FIG. 1, the semiconductor parts are removed (ST107). More specifically, the semiconductor parts 101 which were determined as not satisfying the electrical property standard are removed. In other words, any semiconductor part 101 which was determined to be failed in the individual electrical property evaluation in the step ST114 described above is removed. The step of removing semiconductor parts 101 can eliminate the semiconductor parts 101 determined to be failed from the semiconductor parts 101 to be used in the step of mounting on a mounting substrate described later. In the step of removing the semiconductor parts, the upper face of the structure body 210 is bonded to a support substrate first, followed by removing the substrate 102. The substrate 102 is removed by, for example, a laser lift-off process. This is followed by a step of isolating the semiconductor parts 101 from one another by polishing the first semiconductor layer 11 exposed by the removal of the substrate 102. The first semiconductor layer 11 is polished, for example, by chemical mechanical polishing (CMP). Subsequently, the semiconductor parts 101 present on the support substrate are transferred to another support substrate. The transferred semiconductor parts 101 are those which will be mounted on a mounting substrate in the step of mounting on a mounting substrate described later. In the transferring step, only the semiconductor parts 101 determined to be passed are transferred, and those determined to be failed are not transferred. In this manner, the semiconductor parts 101 used in the mounting step will consist only of passed semiconductor parts 101. Alternatively, the semiconductor parts 101 including those determined to be passed and those determined to be failed may be transferred together, followed by replacing the failed parts with passed parts, i.e., removing the failed parts among the transferred semiconductor parts 101 and placing passed semiconductor parts 101 at the removed positions. In this manner, the semiconductor parts 101 used in the mounting step will consist only of passed semiconductor parts 101.

Then the semiconductor parts are mounted on a mounting substrate (ST108). For example, on a mounting substrate provided with conductive wiring, semiconductor parts 101 are mounted so as to connect the first terminals P1 and the second terminals P2 to the wiring. Subsequently, the support substrate is detached from the semiconductor parts 101. This completes a light emitting device including a mounting substrate and a plurality of semiconductor parts 101 mounted on the mounting substrate. Subsequent to mounting the semiconductor parts 101 on the mounting substrate, a resin having light reflectivity may be applied between the semiconductor parts 101. Furthermore, a wavelength conversion member containing a phosphor may be disposed to cover the semiconductor parts 101.

The removal of semiconductor parts 101 may be conducted after the step of mounting on a mounting substrate. First, the positions of the semiconductor parts 101 determined as not satisfying the electrical property standard are stored in the probe device. Then the positional information of the failed semiconductor parts 101 is stored in a memory device connected to the probe device. Subsequent to mounting the semiconductor parts 101 on a mounting substrate, the failed semiconductor parts 101 are removed based on the positional information stored in the memory device. Subsequently, passed semiconductor parts 101 are disposed at the locations from which the failed semiconductor parts 101 have been removed. A light emitting device may be completed by replacing the failed semiconductor parts 101 with passed semiconductor parts 101 in the manner described above.

According to this embodiment of a method of manufacturing a light emitting device, the evaluation of electrical properties of semiconductor parts 101 can be facilitated because the wiring 250*a* at each location having a larger area than the area of a first terminal P1 or second terminal P2 allows a testing device to be brought into contact easily. Furthermore, in evaluating the electrical properties of the semiconductor parts 101, the electrical properties of four semiconductor parts 101 in each of groups G are evaluated first. Then the semiconductor parts 101 in any of the groups G determined to be failed and the semiconductor parts 101 not included in any group G are individually evaluated. This can efficiently evaluate the electrical properties of a plurality of semiconductor parts 101. Accordingly, the electrical properties of the semiconductor parts 101 included in a light emitting device can be evaluated easily.

In the foregoing, a method of manufacturing a light emitting device according to the present invention has been specifically described with reference to certain forms of implementing the present invention. The subject matter of the present invention, however, is not limited to those described above and must be broadly interpreted based on the scope of the claims. Needless to say, all forms achieved by way of various modifications and alterations based on the present disclosure also fall within the scope of the present invention.

The embodiments of the present invention include the subject matter described below.

(Note 1)

A method of manufacturing a light emitting device comprising:

providing a structure body, the structure body including a substrate and a plurality of semiconductor parts arranged on the substrate wherein,
- the semiconductor parts individually includes:
  - a first semiconductor layer of a first conductivity type,
  - a second semiconductor layer of a second conductivity type,
  - a first terminal electrically connected to the first semiconductor layer, and
  - a second terminal electrically connected to the second semiconductor layer;

disposing an insulating member that covers the semiconductor parts while exposing the first terminals and the second terminals;

forming wirings at locations above the semiconductor parts, wherein,
- the wirings each is connected to the first terminal and the second terminal of two adjacent semiconductor parts in a direction of arrangement,
- the semiconductor parts connected by the wirings are serially connected, and
- in a top view, an area of each of the wirings is larger than an area of the first terminal to which it is connected and is larger than an area of the second terminal to which it is connected;

evaluating electrical properties of the semiconductor parts connected by the wiring by bringing a testing device into contact with the wiring; and removing the insulating member and the wiring.

(Note 2)

The method of manufacturing a light emitting device disclosed in Note 1, wherein in a case in which the electrical properties of the semiconductor parts serially connected do not satisfy a predetermined standard, the evaluation step comprises individually evaluating the semiconductor parts serially connected by bringing the testing device into contact with the wirings at corresponding two adjacent locations.

(Note 3)

The method of manufacturing a light emitting device disclosed in Note 2 further comprising, subsequent to the removing step of the insulating member and the wiring, removing a semiconductor part determined as not satisfying the predetermined standard in the individual evaluation step and disposing a semiconductor part satisfying the electrical property standard in a region from which the failed semiconductor part was removed.

(Note 4)

The method of manufacturing a light emitting device disclosed in any of Notes 1 to 3, wherein each of the semiconductor parts has a quadrangular shape in the top view, and the area of each of the semiconductor parts in the top view is 100 $\mu m^2$ to 2500 $\mu m^2$.

(Note 5)

The method of manufacturing a light emitting device disclosed in any of Notes 1 to 4, wherein the semiconductor parts are arranged on the substrate in a matrix.

What is claimed is:

1. A method of manufacturing a light emitting device comprising:

providing a structure body, the structure body including a substrate and a plurality of semiconductor parts arranged on the substrate, wherein the semiconductor parts individually includes:

a first semiconductor layer of a first conductivity type, a second semiconductor layer of a second conductivity type, a first electrode electrically connected to the first semiconductor layer, a second electrode electrically connected to the second semiconductor layer, a first terminal electrically connected to the first semiconductor layer via the first electrode, and a second terminal electrically connected to the second semiconductor layer via the second electrode;

disposing an insulating member that covers the semiconductor parts while exposing the first terminals and the second terminals, wherein upper faces of the first terminals and upper faces of the second terminals are exposed from the insulating member by polishing after embedding the first terminals and the second terminals in the insulating member;

forming wirings at locations above the semiconductor parts, wherein forming the wirings comprises:

forming a resist on the insulating member located between the first terminal and the second terminal of each semiconductor part, forming a seed layer to continuously cover the first terminals, the second terminals, and the resist of the semiconductor parts arranged in a direction of arrangement, forming a conducting layer on the seed layer, and removing portions of the seed layer and the conducting layer that cover the resist such that the resist is exposed from the seed layer and the conducting layer, wherein, the wirings each is connected to the first terminal and the second terminal of two adjacent semiconductor parts in the direction of arrangement, the semiconductor parts connected by the wirings are serially connected, the semiconductor parts adjacent in a direction perpendicular to the direction of arrangement are not electrically connected by the wirings, and in a top view, an area of each of the wirings is larger than an area of the first terminal to which it is connected and is larger than an area of the second terminal to which it is connected; evaluating electrical properties of a plurality of the semiconductor parts connected by the wirings at once by bringing a testing device into contact with the wirings; and removing the insulating member and the wirings by polishing an upper face side of the structure body.

2. The method of manufacturing a light emitting device according to claim 1, wherein in a case in which the electrical properties of the semiconductor parts serially connected do not satisfy a predetermined standard, the evaluating step comprises individually evaluating the semiconductor parts serially connected by bringing the testing device into contact with the wirings at corresponding two adjacent locations.

3. The method of manufacturing a light emitting device according to claim 2, further comprising, subsequent to removing the insulating member and the wirings, removing a semiconductor part determined as not satisfying the predetermined standard in the individual evaluating step and disposing a semiconductor part satisfying the predetermined standard in a region from which the failed semiconductor part was removed.

4. The method of manufacturing a light emitting device according to claim 1, wherein, each of the semiconductor parts has a quadrangular shape in the top view, and the area of each of the semiconductor parts in the top view is 100 μm2 to 2500 μm2.

5. The method of manufacturing a light emitting device disclosed according to claim 1, wherein the semiconductor parts are arranged on the substrate in a matrix.

6. The method of manufacturing a light emitting device according to claim 1, wherein the area of each of the wirings is two to five times the area of the first terminal.

* * * * *